(12) United States Patent
Tsutsumi et al.

(10) Patent No.: US 11,085,966 B2
(45) Date of Patent: Aug. 10, 2021

(54) BATTERY TEMPERATURE DISPLAY DEVICE OF VEHICLE

(71) Applicant: Honda Motor Co.,Ltd., Tokyo (JP)

(72) Inventors: Hiroki Tsutsumi, Saitama (JP); Motoi Shioaku, Saitama (JP); Taisuke Tsurutani, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 279 days.

(21) Appl. No.: 16/360,023

(22) Filed: Mar. 21, 2019

(65) Prior Publication Data

US 2019/0293721 A1 Sep. 26, 2019

(30) Foreign Application Priority Data

Mar. 22, 2018 (JP) .............................. JP2018-054808

(51) Int. Cl.
*G01R 31/371* (2019.01)
*B60K 35/00* (2006.01)
*H01M 10/48* (2006.01)
*G01R 31/382* (2019.01)
(Continued)

(52) U.S. Cl.
CPC ............ *G01R 31/371* (2019.01); *B60K 35/00* (2013.01); *G01R 31/2891* (2013.01); *G01R 31/382* (2019.01); *H01M 10/443* (2013.01); *H01M 10/486* (2013.01); *B60K 2370/152* (2019.05); *B60K 2370/155* (2019.05); *B60K 2370/168* (2019.05); *G01K 2217/00* (2013.01); *H01M 2220/20* (2013.01)

(58) Field of Classification Search
None
See application file for complete search history.

(56) References Cited

U.S. PATENT DOCUMENTS 5,612,608 A * 3/1997 Ishiguro ................ H02J 7/0047
340/636.12
5,699,050 A * 12/1997 Kanazawa ......... G01R 31/3648
340/636.13
(Continued)

FOREIGN PATENT DOCUMENTS

JP 2008206301 9/2008

*Primary Examiner* — Chico A Foxx
(74) *Attorney, Agent, or Firm* — JCIPRNET

(57) ABSTRACT

A battery temperature display device of a vehicle is provided. The battery temperature display device includes: a plurality of display elements sequentially arranged according to values of a display temperature so as to respectively display each of a plurality of temperature ranges into which a predetermined total temperature display range of the secondary battery is divided, wherein the display elements include a highest temperature display element and a lowest temperature display element respectively display temperature ranges of a highest temperature and a lowest temperature in which discharge and charge of the secondary battery are restricted in the total temperature display range; and a display control part for changing boundaries between the highest temperature display element, the lowest temperature display element and other display elements or thresholds related to divisions of the display temperature in accordance with an operation state of the vehicle or a use state of the secondary battery.

2 Claims, 7 Drawing Sheets

(51) Int. Cl.
*G01R 31/28* (2006.01)
*H01M 10/44* (2006.01)

(56) References Cited

U.S. PATENT DOCUMENTS

| | | | | |
|---|---|---|---|---|
| 7,691,525 B2* | 4/2010 | Um | ................... | H01M 10/486 |
| | | | | 429/90 |
| 9,709,633 B2* | 7/2017 | Arizono | ............... | G01R 31/382 |
| 10,440,542 B2* | 10/2019 | Thomas | ................. | H04W 4/80 |
| 2008/0018304 A1* | 1/2008 | Litingtun | .............. | H02J 7/0031 |
| | | | | 320/134 |
| 2009/0015205 A1* | 1/2009 | Katayama | ............ | B60L 58/25 |
| | | | | 320/134 |
| 2009/0326749 A1* | 12/2009 | Uchida | .................. | B60L 58/16 |
| | | | | 701/22 |
| 2011/0078092 A1* | 3/2011 | Kim | ....................... | B60L 53/65 |
| | | | | 705/412 |
| 2011/0273141 A1* | 11/2011 | Kanbayashi | ............ | B60L 58/25 |
| | | | | 320/134 |
| 2013/0158913 A1* | 6/2013 | Ketkar | ................ | H01M 10/443 |
| | | | | 702/63 |
| 2013/0221741 A1* | 8/2013 | Stanek | ...................... | B60L 3/04 |
| | | | | 307/9.1 |
| 2013/0274971 A1* | 10/2013 | Takahashi | ................ | B60L 7/18 |
| | | | | 701/22 |
| 2014/0290595 A1* | 10/2014 | Owens | .................... | F02B 43/10 |
| | | | | 123/3 |
| 2016/0243959 A1* | 8/2016 | Kishida | ................ | B60W 20/00 |
| 2017/0066433 A1* | 3/2017 | Muta | .................... | B60W 10/26 |
| 2017/0066434 A1* | 3/2017 | Kato | .................... | B60W 10/08 |
| 2017/0144562 A1* | 5/2017 | Thomas | ............ | H01M 10/4257 |
| 2018/0040928 A1* | 2/2018 | Yu | ....................... | H01M 10/425 |
| 2018/0076492 A1* | 3/2018 | Chaturvedi | ......... | H01M 10/486 |
| 2019/0039477 A1* | 2/2019 | Ohgaki | .............. | H01M 10/625 |

* cited by examiner

BATTERY TEMPERATURE DISPLAY DEVICE OF VEHICLE

CROSS-REFERENCE TO RELATED APPLICATION

This application claims the priority benefit of Japan Application No. 2018-054808, filed on Mar. 22, 2018. The entirety of the above-mentioned patent application is hereby incorporated by reference herein and made a part of this specification.

BACKGROUND

Technical Field

The disclosure relates to a battery temperature display device of a vehicle and more particularly to a battery temperature display device of a vehicle for displaying the temperature of a secondary battery which supplies power to a motor generator connected to drive wheels.

Description of Related Art

Conventionally, it is a known technique to provide, as a power meter for displaying power exchanged between a secondary battery installed on a vehicle and a motor generator connected to drive wheels, a temperature display part for displaying the temperature of the secondary battery (See, for example, Japanese Laid-open No. 2008-206301 (Patent Document 1)). The technique of Patent Document 1 shows an example in which it is configured that in a power display part where a pointer moves on an arc-shaped display pattern on the power meter, the power display part also functions as a temperature display part by changing the display color of this display pattern according to the temperature. Further, an example is disclosed in which a rod-shaped temperature display part is disposed separately in the vicinity of the display pattern in the power display part to perform the power display and the temperature display. Generally, in the secondary battery, the power amount that can be supplied to the motor generator and the power amount that can absorb from regeneration in the motor generator change in accordance with the temperature. In the technique of Patent Document 1, the battery temperature is displayed together with the power display. Therefore, if a driver takes the display of the battery temperature into consideration, there is a possibility to reduce a sense of incongruity the driver felt about the correlation between the extent of the margin of the power storage amount of the secondary battery recognized from the display of the power meter and the actual behavior of the vehicle.

Changes in the battery performance with respect to the same variation range of the battery temperature exhibit different characteristics in a case where the secondary battery is discharging to supply power to the motor generator and in a case where the secondary battery is being charged by absorbing regenerative power in the motor generator. However, according to the technique of Patent Document 1, the battery temperature is uniformly displayed irrespective of the operation state of the secondary battery. For this reason, there may be a case where the driver feels a sense of incongruity in the correlation between a change in the behavior of the vehicle caused by the extent of change in the battery performance and the display value in the temperature display part.

SUMMARY

A battery temperature display device of a vehicle (such as the vehicle V to be described later) displays a temperature of a secondary battery (such as the secondary battery 1 to be described later) which supplies power to a motor generator (such as the motor generator M to be described later) connected to drive wheels (such as the drive wheels W to be described later) and is characterized in including: a plurality of display elements (such as the segments on the battery temperature meter 6 to be described later) sequentially arranged according to values of a display temperature so as to respectively display each of a plurality of temperature ranges into which a predetermined total temperature display range of the secondary battery is divided, wherein the plurality of display elements include a highest temperature display element (such as the segment 61 to be described later) that displays a temperature range of the highest temperature in which discharge and charge of the secondary battery are restricted in the total temperature display range, and a lowest temperature display element (such as the segment 62 to be described later) that displays a temperature range of the lowest temperature in which the discharge and charge of the secondary battery are restricted in the total temperature display range; and a display control part (such as the display control device TIU to be described later) for changing boundaries between the highest temperature display element, the lowest temperature display element and other display elements or thresholds related to divisions of the display temperature in accordance with an operation state of the vehicle or a use state of the secondary battery.

DESCRIPTION OF THE EMBODIMENTS

Figure 1:
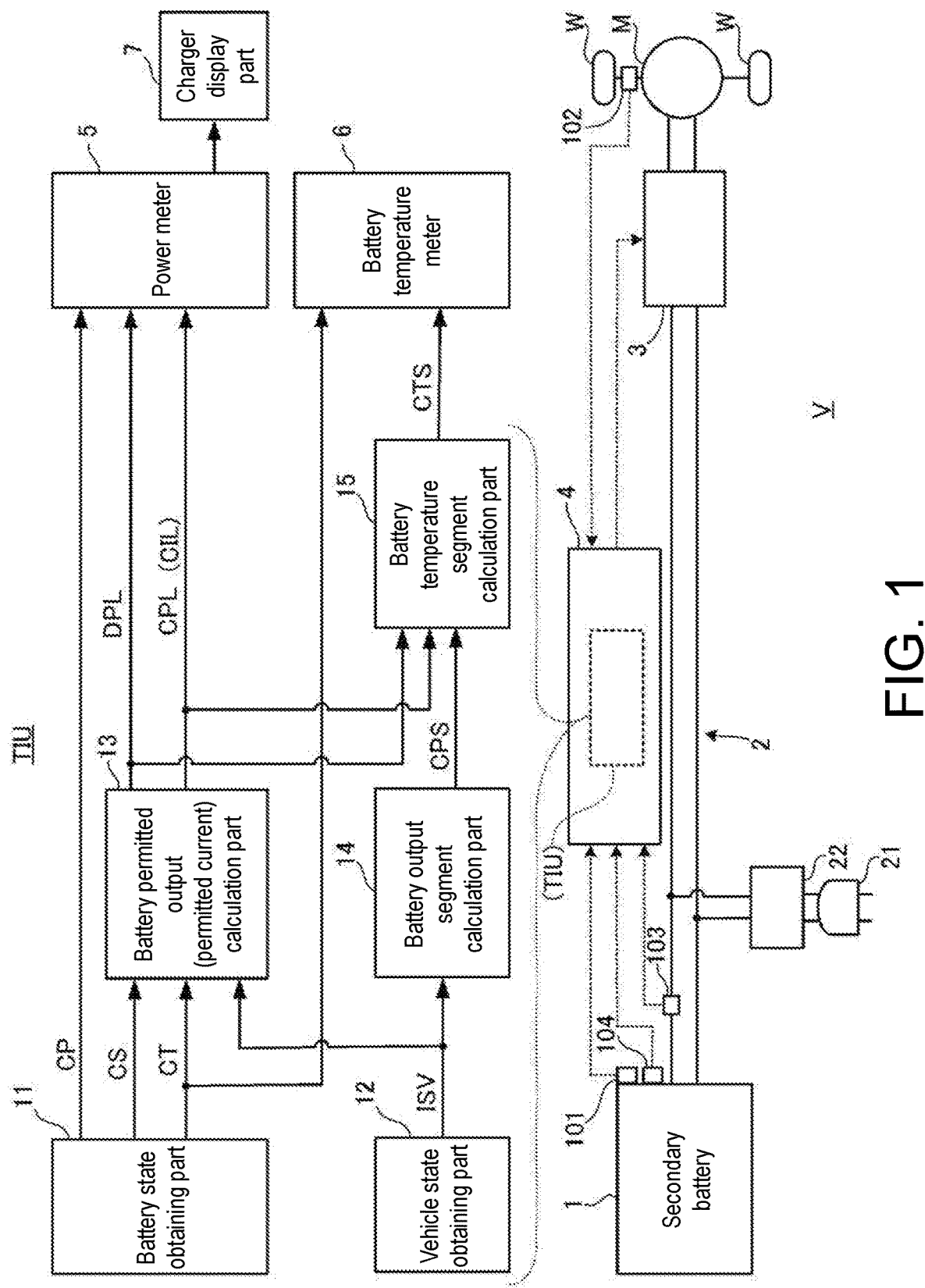
FIG. 1 is a diagram showing a battery temperature display device of a vehicle according to the disclosure.

The disclosure is directed to provide a battery temperature display device of a vehicle, which makes the driver hard to feel a sense of incongruity in the correlation between the change in the behavior of the vehicle and the display value of the temperature of the secondary battery which supplies power to the motor generator.

The battery temperature display device of the vehicle is characterized in that the display control part makes a change of the boundaries or the thresholds based on any one of following conditions (a) to (c) or a combination thereof: (a) whether the operation state of the vehicle is during traveling or during the charge for the secondary battery; (b) whether the use state of the secondary battery is during the discharge or during the charge with regenerative power; and (c) whether a duration of the charge and discharge of the secondary battery has exceeded a predetermined dead zone period related to the change.

In the battery temperature display device of the vehicle, the mode of the temperature display by segments, which are examples of the plurality of display elements sequentially arranged according to the values of the display temperature so as to respectively display each of the plurality of temperature ranges into which the predetermined total temperature display range of the secondary battery is divided, is changed in accordance with the operation state of the vehicle or the use state of the secondary battery. That is, the plurality of display elements include the highest temperature display element that displays the temperature range of the highest temperature in which the discharge and charge of the secondary battery are restricted, and the lowest temperature display element that displays the temperature range of the lowest temperature for the restriction. The boundaries between the highest temperature display element, the lowest temperature display element and other display elements or the thresholds related to the divisions of the display temperature are changed in accordance with the operation state of the vehicle or the use state of the secondary battery.

Therefore, the driver can recognize the extent to which the temperature of the secondary battery affects the change in the battery performance at the present time. As a result, the driver can estimate the extent of change in the behavior of the vehicle V caused by the change in the performance of the secondary battery, and the driver is hard to feel a sense of incongruity in the correlation between the change in the behavior of the vehicle and the display value of the temperature of the secondary battery.

In the battery temperature display device of the vehicle, the change is made based on any one of the following conditions (a) to (c) or a combination thereof: (a) whether the operation state of the vehicle is during the traveling or during the charge for the secondary battery; (b) whether the use state of the secondary battery is during the discharge or during the charge with regenerative power; and (c) whether the duration of the charge and discharge of the secondary battery has exceeded the predetermined dead zone period related to the change of the boundaries or the thresholds related to the divisions of the display temperature. Therefore, since the boundaries between the highest temperature display element, the lowest temperature display element and other display elements or the thresholds related to the divisions of the display temperature are changed as in the above (a) and (b), the driver is hard to feel a sense of incongruity in the correlation between the change in the behavior of the vehicle and the display value of the temperature of the secondary battery. Further, since the boundaries between the highest temperature display element, the lowest temperature display element and other display elements or the thresholds related to the divisions of the display temperature are changed as in the above (c), i.e. in accordance with whether the dead zone period related to the change has been exceeded, the change is not made excessively frequently, and a stable temperature display is performed, and the driver is hard to feel a further sense of incongruity in the correlation between the change in the behavior of the vehicle and the display value of the temperature of the secondary battery.

Hereinafter, an embodiment of the disclosure will be described with reference to the drawings.

FIG. 1 is a diagram showing a configuration of a battery temperature display device of a vehicle according to the present embodiment. In the present embodiment, a so-called electric vehicle which supplies power to a motor generator connected to drive wheels from a secondary battery as a power source will be described as an example of a vehicle V. However, the vehicle V may be an electric vehicle including a main battery having a relatively low output weight density and a high energy weight density and a sub battery having a relatively high output weight density and a low energy weight density as the secondary battery.

The vehicle V includes a secondary battery 1, a motor generator M, drive wheels W, and a display control device TIU. The motor generator M mainly generates power for the vehicle V to travel. The motor generator M is connected to the drive wheels W. A torque generated by the motor generator M by supplying power from the secondary battery 1 to the motor generator M is transmitted to the drive wheels W, causes the drive wheels W to rotate, and causes the vehicle V to travel. In addition, the motor generator M acts as a generator when the vehicle V decelerates and regenerates. The regenerative power generated by the motor generator M is charged to the secondary battery 1.

A power line 2 connecting the secondary battery 1 and the motor generator M, an inverter 3 provided on the power line 2, and an electrical control unit 4 (hereinafter the abbreviation of the "ECU 4" is used) for controlling each part of the vehicle V including the inverter 3 are provided. In the present embodiment, the display control device TIU is configured as one functional part in the ECU 4, but the disclosure is not limited to this example. The display control device TIU may be configured as a separate ECU whose main function is in the control related to the temperature display of the secondary battery 1 or as an electronic circuit for controlling the temperature display.

The inverter 3 is provided on the power line 2. The inverter 3 is, for example, a pulse width modulation (PWM) inverter with pulse width modulation and provided with a bridge circuit configured by bridge-connecting a plurality of switching elements and has a function of converting DC power and AC power. The inverter 3 operates in accordance with a drive signal transmitted from a gate drive circuit of the ECU 4 to convert DC power supplied from the secondary battery 1 into three-phase AC power and supply the converted three-phase AC power to the motor generator M and to convert the three-phase AC power supplied from the motor generator M into DC power and supply the converted DC power to the secondary battery 1.

The ECU 4 is a microcomputer and is responsible for controlling the inverter 3 of the vehicle V. In addition, as to be described later, the ECU 4 functions as the display control device TIU for performing a control related to the temperature display of the secondary battery 1.

A temperature detection output of a temperature sensor 101 for detecting the temperature of the secondary battery 1 is supplied to the ECU 4. Further, a vehicle speed detection output of a vehicle speed sensor 102 functionally combined to the drive wheels W or the motor generator M is supplied to the ECU 4. Furthermore, a current detection output of a current sensor 103 for detecting the current of the secondary battery 1 and a voltage detection output of a voltage sensor 104 for detecting the voltage of the secondary battery 1 are supplied to the ECU 4.

The secondary battery 1 is a battery capable of both the discharge for converting chemical energy into electric energy and the charge for converting electric energy into chemical energy. The following describes a case of using a so-called lithium ion storage battery, which performs the charge and discharge by moving lithium ions between electrodes, as the secondary battery 1, but the object of the temperature display in the disclosure is not limited thereto.

A connection part 21 for receiving power from an external power source (not shown) such as a commercial AC power source is connected to the power line 2 via a charge circuit 22.

A power meter 5 for displaying input/output power of the secondary battery 1 and a battery temperature meter 6 for displaying the temperature of the secondary battery 1 are provided in the vehicle V. A charger display part 7 is attached to the power meter 5 in this example. A display control signal is supplied from the display control device TIU to the power meter 5 and the battery temperature meter 6, and the displays thereof are controlled as described later.

The display control device TIU includes a battery state obtaining part 11, a vehicle state obtaining part 12, a battery permitted output calculation part 13, a battery output segment calculation part 14, and a battery temperature segment calculation part 15.

The battery state obtaining part 11 performs a predetermined calculation based on the temperature detection output of the temperature sensor 101, the current detection output of the current sensor 103, and the voltage detection output of the voltage sensor 104, and outputs battery output data CP corresponding to the output of the battery, battery state of charge (SOC) data CS corresponding to the SOC of the battery, and battery temperature data CT corresponding to the temperature of the battery. Here, SOC is the charge rate of the secondary battery (the ratio of the remaining capacity of the secondary battery to the full charge capacity) expressed as a percentage.

The vehicle state obtaining part 12 calculates and outputs vehicle status data ISV which indicates the state of the vehicle V based on the vehicle speed detection output of the vehicle speed sensor 102, a state detection output from a state detection circuit (not shown) indicating whether the secondary battery 1 is being charged via the charge circuit 22 by connecting the connection part 21 to an external power source, and stratification information of the merchantability (to be described later) about the vehicle V.

The battery permitted output calculation part 13 receives the battery SOC data CS and the battery temperature data CT from the battery state obtaining part 11. Further, the battery permitted output calculation part 13 receives the vehicle status data ISV from the vehicle state obtaining part 12. The battery permitted output calculation part 13 calculates and outputs traveling-time power limit data DPL which indicates the limit value of the discharge of the secondary battery 1 (supply of power to the motor generator M as a load) and the absorption of the regenerative power by the secondary battery 1 (charge by the regenerative power of the motor generator M) during the traveling of the vehicle V based on the supplied battery SOC data CS, battery temperature data CT and vehicle status data ISV. Further, the battery permitted output calculation part 13 calculates and outputs charge-time power limit data CPL which indicates a charge-time power amount that does not adversely affect the battery life based on the supplied data as described above.

In addition, the battery permitted output calculation part 13 may be configured to calculate and output charge-time current limit data CIL which indicates a charge-time current amount that does not adversely affect the battery life in place of the charge-time power limit data CPL. In this case, the battery permitted output calculation part 13 should be referred to as a battery permitted current calculation part, but in terms of obtaining a parameter for displaying the temperature of the battery, it is the same as in the above case of the charge-time power limit data CPL; therefore, the following description uniformly describes with the battery permitted output calculation part 13.

The battery output segment calculation part 14 receives the vehicle status data ISV from the vehicle state obtaining part 12 and calculates and outputs output segment threshold data CPS. The output segment threshold data CPS is data indicating a threshold for delimiting partial ranges of the temperature display to be assigned to each segment of the battery temperature meter 6.

Here, the battery output segment calculation part 14 will be described in more detail with reference to FIG. 2.

Figure 2:
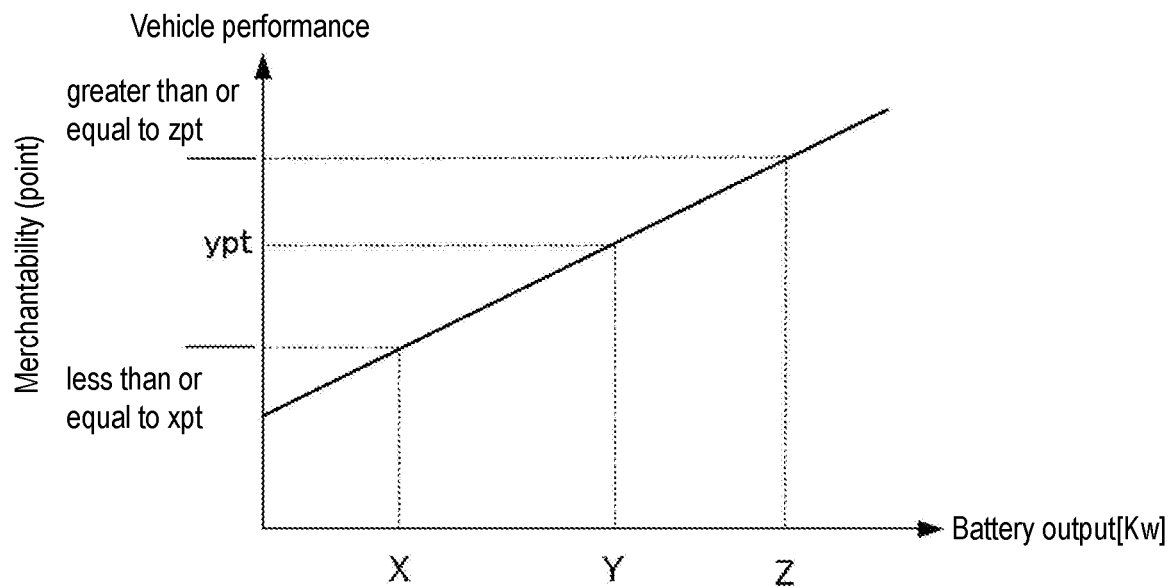
FIG. 2 is a diagram for explaining an event that is taken into consideration at the time of calculating the output segment threshold data in the battery output segment calculation part in the battery temperature display device of the vehicle of FIG. 1.

FIG. 2 is a diagram for explaining an event that is taken into consideration at the time of calculating the output segment threshold data CPS in the battery output segment calculation part 14.

FIG. 2 shows the correlation between the values of the battery output and the merchantability. The merchantability here is the grade of a product represented by a point value. That is, it is an overall point value obtained by integrating points calculated according to predetermined calculation criteria for vehicle performance, such as 0 to 100 Km/h acceleration time, cruise vehicle speed, rapid charge time, etc., and various other factors. Stratification information which is the grade as a product is represented by this point value. Vehicles with high merchantability have high vehicle performance. Therefore, a correlation between the values of the battery output and the merchantability is set so as to exhibit a tendency in which vehicles with high merchantability have a high battery output.

In the example of FIG. 2, in a case where the merchantability is less than or equal to x points, the battery output is in the region less than or equal to X [Kw]. In a case where the merchantability is greater than or equal to z points, the battery output is in the region greater than or equal to Z [Kw]. In a case where the merchantability is y points between x points and z points, the battery output is in the region of Y [Kw] between X [Kw] and Z [Kw].

The battery output segment calculation part 14 performs calculation based on the vehicle status data ISV supplied from the vehicle state obtaining part 12 and with the merchantability of the vehicle V, which exhibits a tendency as shown in FIG. 2, taken into consideration. According to this calculation, in accordance with the above-described vehicle speed detection output and the state detection output indicating whether the secondary battery 1 is being charged, the battery output segment calculation part 14 calculates and outputs the output segment threshold data CPS that delimits the partial ranges of the temperature display to be assigned to the segments of the battery temperature meter 6.

The battery temperature segment calculation part 15 receives the traveling-time power limit data DPL and the charge-time power limit data CPL from the battery permitted output calculation part 13 and further receives the output segment threshold data CPS from the battery output segment calculation part 14 and calculates and outputs the temperature segment threshold data CTS.

Here, the battery temperature segment calculation part 15 will be described in more detail with reference to FIG. 3.

Figure 3:
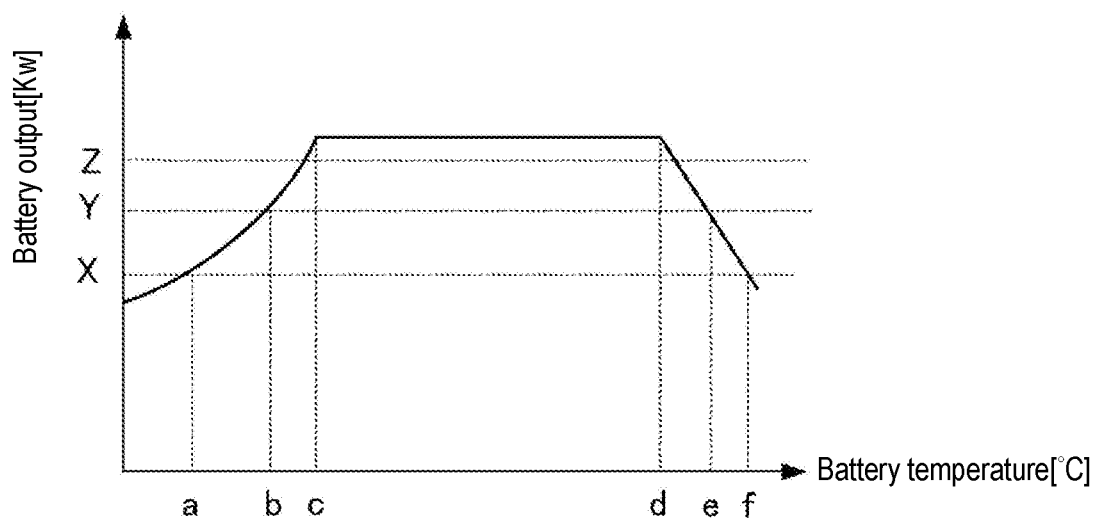
FIG. 3 is a diagram for explaining an event that is taken into consideration at the time of calculating the temperature segment threshold data CTS in the battery temperature segment calculation part 15 in the battery temperature display device of the vehicle of FIG. 1.

FIG. 3 is a diagram for explaining an event that is taken into consideration at the time of calculating the temperature segment threshold data CTS in the battery temperature segment calculation part 15.

FIG. 3 shows the correlation between the tolerance value of the input/output power (referred to as a power limit as appropriate), which is set with shortening of the life of the secondary battery 1, etc., taken into consideration, with respect to the battery temperature. Here, the battery outputs of X [Kw], Y [Kw] and Z [Kw] in FIG. 3 are power values correlated with the merchantability in FIG. 2 and are supplied from the battery output segment calculation part 14 as the output segment threshold data CPS. a [° C.], b [° C.], and c [° C.] correspond to the battery temperature rising order in accordance with the change on the rising side of the change of the battery outputs including X [Kw], Y [Kw], and Z [Kw]. In addition, d [° C.], e [° C.], and f [° C.] correspond to the battery temperature rising order in accordance with the change of the battery outputs on the falling side.

As can be seen from FIG. 3, even if the battery temperature is the lowest a [° C.], the power limit is stratified as X<Y<Z depending on the merchantability. This tendency is the same in the regions of a [° C.], b [° C.], and c [° C.] where the battery temperature is relatively low. In addition, the power limit is also stratified as X<Y<Z depending on the merchantability in the regions of d [° C.], e [° C.], and f [° C.] where the battery temperature is relatively high.

The bold solid curve in FIG. 3 defines the relationship between the battery output (the power limit) and the temperature (the temperature display) corresponding to the grade of the product set for the vehicle V. That is, the bold solid curve shows settings related to characteristics of the power limit versus the battery temperature as values obtained by adjusting the values for the traveling-time power limit data DPL and the charge-time power limit data CPL supplied from the battery permitted output calculation part 13 according to the battery outputs of X [Kw], Y [Kw] and Z [Kw] correlated with the merchantability. In accordance with the characteristics set as described with reference to FIG. 3, the battery temperature segment calculation part 15 calculates the temperature segment threshold data CTS based on the traveling-time power limit data DPL, the charge-time power limit data CPL, and the output segment threshold data CPS.

The battery temperature meter 6 included in the vehicle V receives the battery temperature data CT from the battery state obtaining part 11, further receives the temperature segment threshold data CTS described with reference to FIG. 3, and displays the temperature of the secondary battery 1 on its own display part.

More specifically, the battery temperature meter 6 has segments which are a plurality of display elements sequentially arranged according to the values of the display temperature so as to respectively display each of display ranges, which are a plurality of partial display ranges into which the total temperature display range which is the predetermined total temperature display range of the secondary battery 1 is divided. The plurality of segments include an upper limit segment 61 that corresponds to a highest temperature display element for displaying a temperature range of the highest temperature in which the discharge and charge of the secondary battery 1 are restricted in the total temperature display range, and the lower limit segment 62 corresponds to a lowest temperature display element for displaying a temperature range of the lowest temperature in which the discharge and charge of the secondary battery 1 are restricted in the total temperature display range. In the present embodiment, the boundaries between the upper limit segment 61, the lower limit segment 62 and other segments or the thresholds related to divisions of the display temperature are changed based on the temperature segment threshold data CTS from the battery temperature segment calculation part 15 of the display control device TIU.

Figure 4:
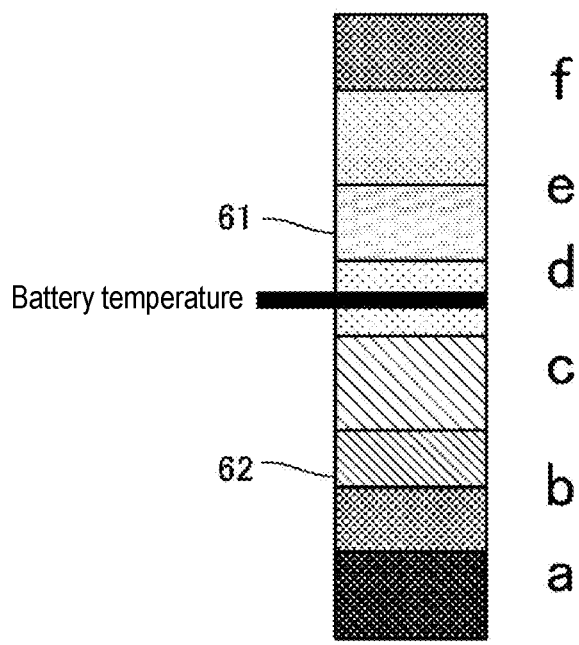
FIG. 4 is a diagram showing a display example of the battery temperature meter in the battery temperature display device of the vehicle of FIG. 1.

FIG. 4 shows a display example of the temperature of the secondary battery 1 on the battery temperature meter 6.

a to f in FIG. 4 correspond to the battery temperatures a to f in FIG. 3, and the temperature values are stratified in color by segments which are the plurality of display elements. In the case where the secondary battery 1 of the vehicle V exhibits the characteristics as shown by the bold solid line in FIG. 3, the boundary between the lower limit segment 62 and other segments or the division of the display temperature is changed between c and b. Further, the boundary between the upper limit segment 61 and other segments or the division of the display temperature is changed between d and e. For the total temperature display range displayed as described above, the current temperature corresponding to the battery temperature data CT supplied to the battery temperature meter 6 is indicated by an indication bar labeled with "battery temperature."

On the other hand, the power meter 5 provided in the vehicle V receives the battery output data CP from the battery state obtaining part 11, further receives the traveling-time power limit data DPL and the charge-time power limit data CPL, which are the outputs of the battery permitted output calculation part 13, and displays the input/output power of the secondary battery 1 on its own display part.

The power meter 5 can take a form of having the charger display part 7 attached thereto. In this case, the charger display part 7 displays on a display whether the secondary battery 1 is being charged via the charge circuit 22 by connecting the connection part 21 of FIG. 1 to an external power source.

Here, other examples of events that are taken into consideration regarding the merchantability of the vehicle described above with reference to FIG. 2 will be described with reference to FIGS. 5 and 6.

Figure 5:
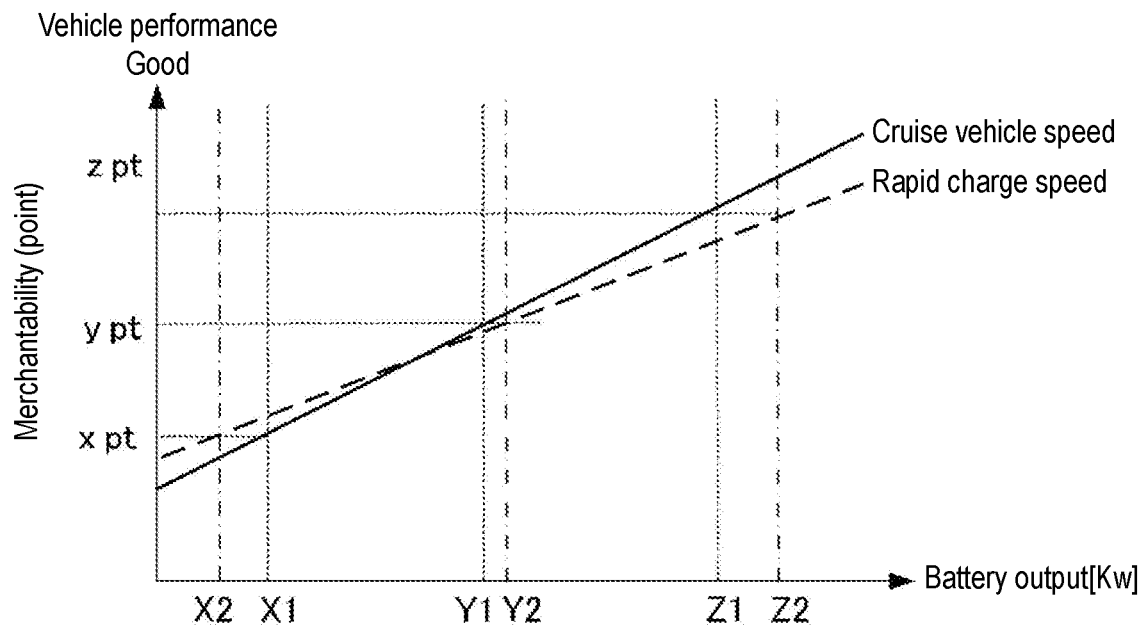
FIG. 5 is a diagram for explaining another event that is taken into consideration at the time of calculating the output segment threshold data in the battery output segment calculation part in the battery temperature display device of the vehicle of FIG. 1.

FIG. 5 is a diagram for explaining another event that is taken into consideration at the time of calculating the output segment threshold data in the battery output segment calculation part in the battery temperature display device of the vehicle of FIG. 1. Here, other events refer to the rapid charge speed and the cruise vehicle speed. In detail, the rapid charge speed and the cruise vehicle speed are taken into consideration as parameters related to the battery output corresponding to the point value of the merchantability of the vehicle (the grade of the product).

The rapid charge speed is set to have a tendency of being faster as the point value of the merchantability is higher. Further, the cruise vehicle speed is set to have a tendency of being faster as the point value of the merchantability is higher.

As shown in FIG. 5, the battery outputs corresponding to x points, y points, and z points, which are the points of the merchantability with a focus on the rapid charge speed, are set as X2 [Kw], Y2 [Kw], and Z2 [Kw]. Further, the battery outputs corresponding to x points, y points, and z points, which are the points of the merchantability with a focus on the cruise vehicle speed, are set as X1 [Kw], Y1 [Kw], and Z1 [Kw].

Figure 6:
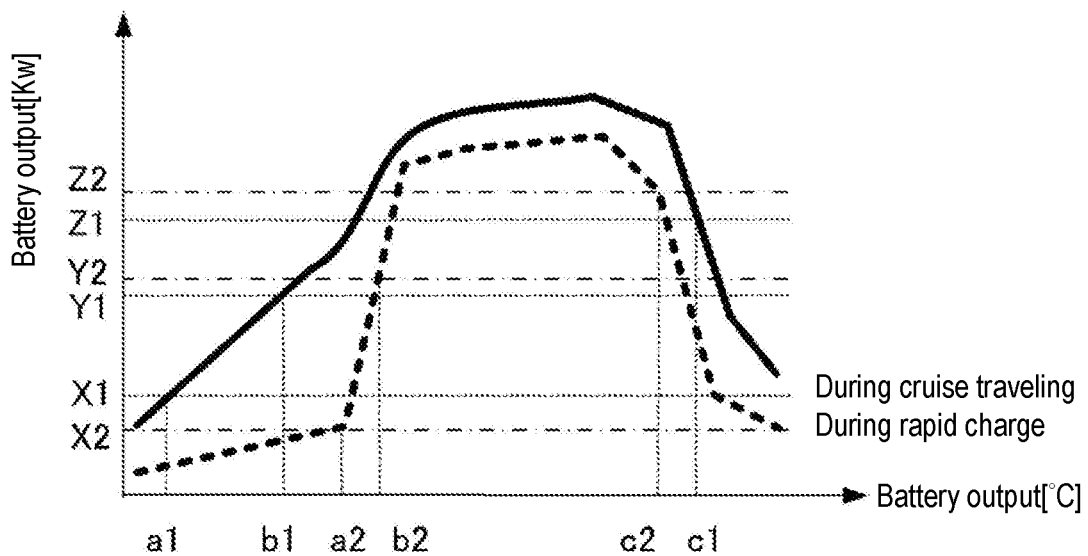
FIG. 6 is a diagram showing the values of the battery temperature set corresponding to the values of the battery output according to the merchantability of the vehicle in FIG. 5.

FIG. 6 is a diagram showing the values of the battery temperature set corresponding to the values of the battery output according to the merchantability of the vehicle in FIG. 5.

In FIG. 6, characteristics of the secondary battery 1 at the time of discharge during cruise traveling of the vehicle V are shown by a solid line, and characteristics of the secondary battery 1 at the time of charge by rapid charge are shown by a broken line. With a focus on the characteristics at the time of charge shown by the broken line, the battery temperatures a2 [° C.], b2 [° C.], and c2 [° C.] are set corresponding to X2 [Kw], Y2 [Kw], and Z2 [Kw] which are the battery outputs corresponding to the merchantability of FIG. 5. Next, with a focus on the characteristics of the secondary battery 1 at the time of discharge during the cruise traveling shown by the solid line, the battery temperatures a1 [° C.], b1 [° C.], and c1 [° C.] are set corresponding to X1 [Kw], Y1 [Kw], and Z1 [Kw] which are the battery outputs corresponding to the merchantability of FIG. 5.

When FIG. 6 is observed at the same battery temperature, the power (the power limit) of the secondary battery 1 at the time of discharge during the cruise traveling shown by the solid line is always higher than the value of the power (the power limit) of the secondary battery 1 at the time of charge by the rapid charge. The reason for this is that it is necessary to narrow down the charge power in order to suppress precipitation of Li metal on the negative electrode surface of the secondary battery 1 at the time of charge whereas such precipitation of Li metal does not occur at the time of discharge, and thus it is not necessary to narrow down the discharge power.

In FIG. 6, during the cruise traveling (during the discharge) shown by the solid line, there is a margin in the power limit between b1 [° C.] and c1 [° C.], which is a temperature range that can be used without damaging the secondary battery 1. Further, during the rapid charge shown by the broken line, there is a margin in the power limit between b2 [° C.] and c2 [° C.], which is a temperature range that can be used without damaging the secondary battery 1. As described above, the temperature range that can be used without damaging the secondary battery 1 is displayed on the battery temperature meter 6 as shown in FIG. 7, for example.

Figure 7:
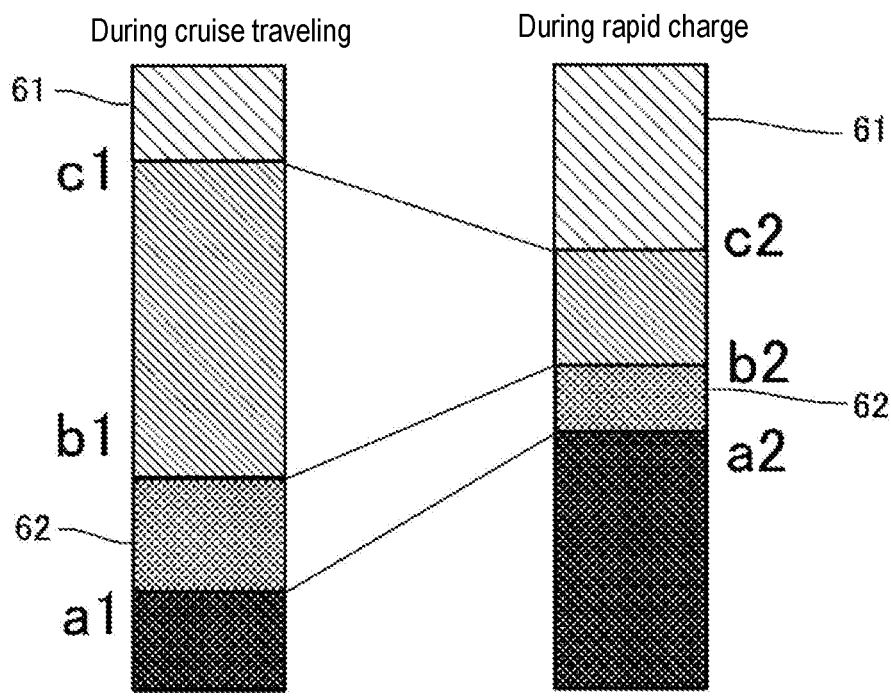
FIG. 7 is a diagram showing a display example in a case where the temperature tolerance value is set as shown in FIG. 6 to perform the temperature display on the battery temperature meter.

FIG. 7 is a diagram showing a display example in a case where the temperature tolerance value is set as described with reference to FIG. 6 to perform the temperature display on the battery temperature meter. The display during the cruise traveling is shown on the left side of FIG. 7, and the display during the rapid charge is shown on the right side of FIG. 7.

As shown in FIG. 7, the range between b1 [° C.] and c1 [° C.], which is the temperature range that can be used without damaging the secondary battery 1 during the cruise traveling, is displayed, for example, by one segment in a certain intermediate color. Further, the range between b2 [° C.] and c2 [° C.], which is the temperature range that can be used without damaging the secondary battery 1 during the rapid charge, is displayed by the same single segment as above.

As shown in FIG. 7, the boundaries between the upper limit segment 61, the lower limit segment 62 and other segments are changed depending on whether it is during the cruise traveling or during the rapid charge, the upper limit segment 61 and the lower limit segment 62 being respectively above the upper limit and below the lower limit of the temperature range that can be used without damaging the secondary battery 1.

Next, display modes on the power meter 5 and the battery temperature meter 6 will be described with reference to FIGS. 8 to 12. Further, FIGS. 8 to 11 show modes in which the power meter 5 and the battery temperature meter 6 are separately provided, and FIG. 12 shows a mode in which the power meter 5 and the battery temperature meter 6 are integrally provided.

In any of the power meter displays of FIGS. 8 to 11, the apex of the semi-arc band is graduated with the charge/discharge power of 0. The portion denoted as "charge limit" at the end portion that drops from this 0 to the left side corresponds to the charge power limit value. Further, the portion denoted as "discharge limit" at the end portion that drops from this 0 to the right side corresponds to the discharge power limit value. An indication bar CPI indicates the power at the present time.

In any of the battery temperature meter displays in FIGS. 8 to 11, the temperature values are divided and displayed in a segment display using a plurality of segments over the range of the temperature values from a to f in the order from the lower temperature value to the higher temperature value.

Figure 8:
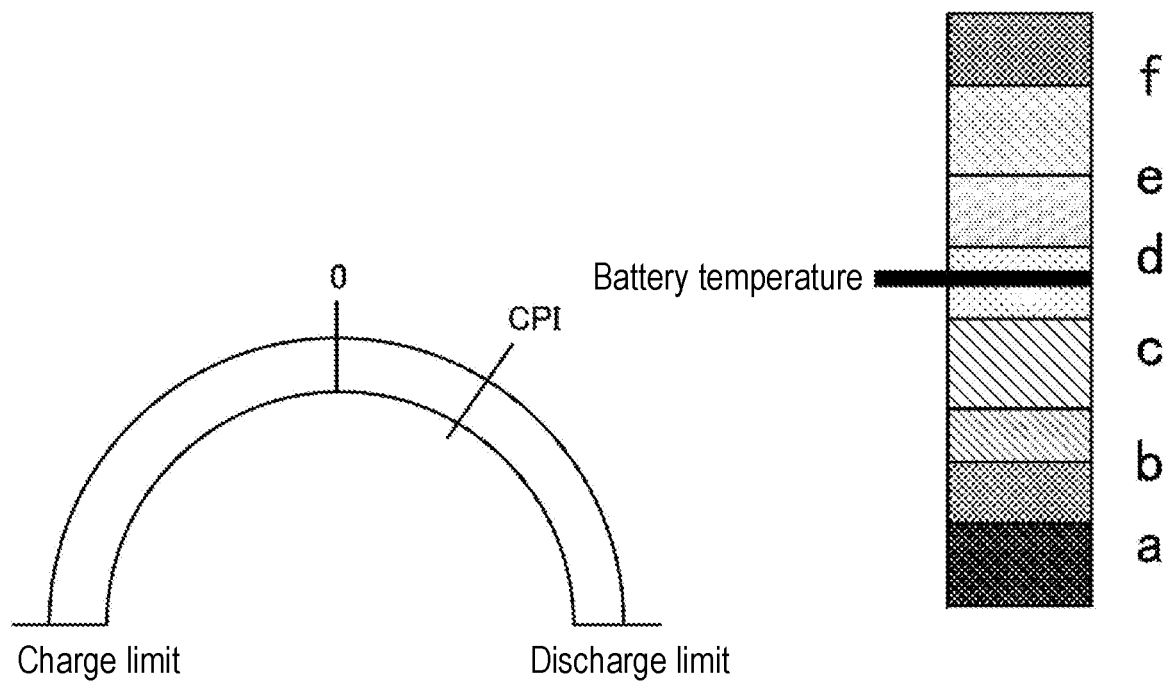
FIG. 8 is a diagram showing one display example of the power meter and the battery temperature meter in the battery temperature display device of the vehicle of FIG. 1.

In the battery temperature meter display of FIG. 8, the range of the display is divided by colors of all of the plurality of segments. The current value of the temperature is indicated by an indication bar labeled with "battery temperature."

Figure 9:
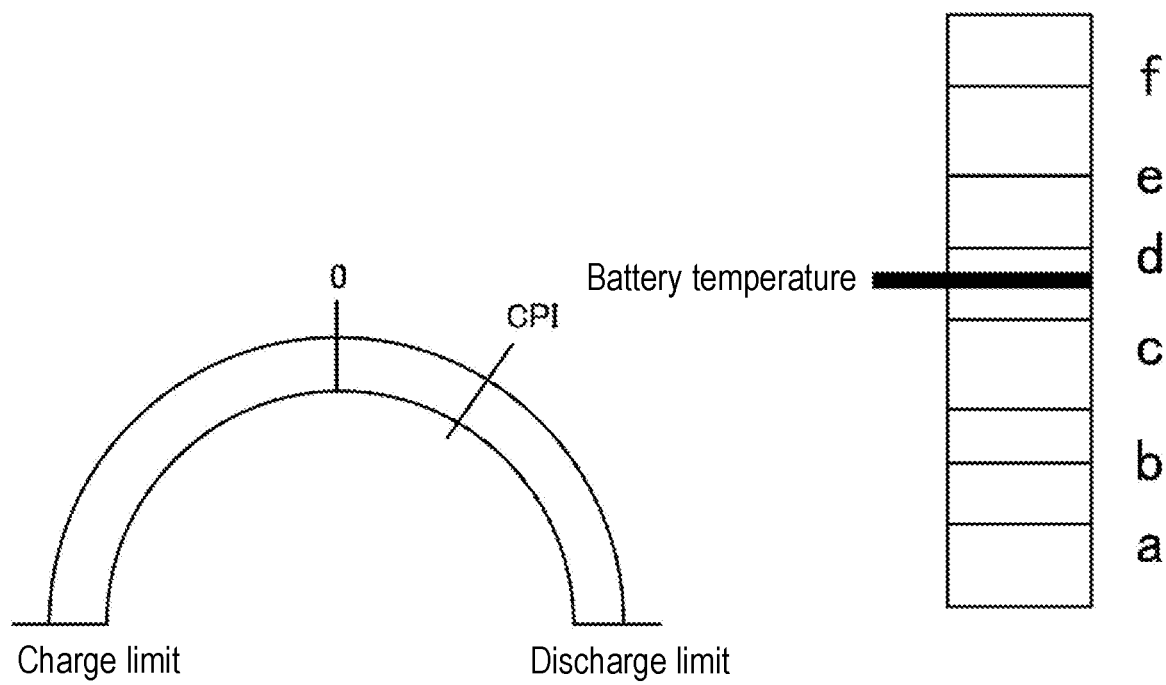
FIG. 9 is a diagram showing another display example of the power meter and the battery temperature meter in the battery temperature display device of the vehicle of FIG. 1.

In the battery temperature meter display of FIG. 9, the range of the display is divided by the boundaries of the plurality of segments all in monochrome. The current value of the temperature is indicated by an indication bar labeled with "battery temperature."

Figure 10:
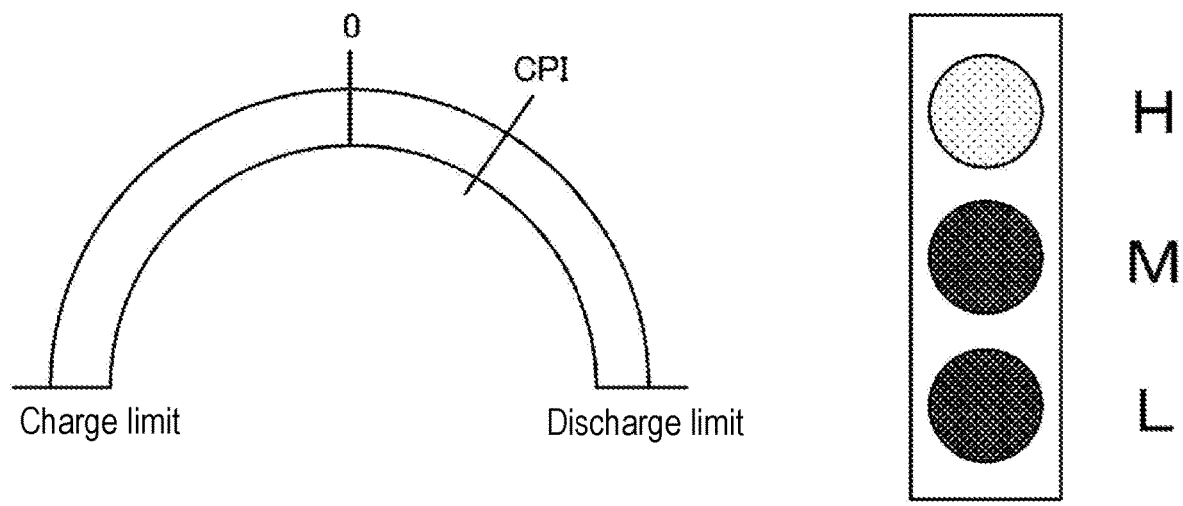
FIG. 10 is a diagram showing another display example of the power meter and the battery temperature meter in the battery temperature display device of the vehicle of FIG. 1.

The battery temperature meter display of FIG. 10 does not indicate the current value but shows a discrete display according to which range the current value of the temperature corresponds to when divided into three ranges. In other words, the temperature range of the secondary battery 1 is divided into three cases, including a case where it is greater than or equal to the value corresponding to the power limit value on the upper limit side, a case where it is less than or equal to the value corresponding to the power limit value on the lower limit side, and a case where it is a value corresponding to the range of the power limit value between the upper limit side and the lower limit side, and is displayed correspondingly. In the case where it is greater than or equal to the value corresponding to the power limit value on the upper limit side, the indication light of the "H" position lights up. Further, in the case where it is less than or equal to the value corresponding to the power limit value on the lower limit side, the indication light of the "L" position lights up. In the case where it is a value corresponding to the range of the power limit value between the upper limit side and the lower limit side, the indication light of the "M" position lights up. In the example of FIG. 10, in the case where the temperature value is greater than or equal to the value corresponding to the power limit value on the upper limit side, the indication light of the "H" position lights up, and the other lights are off.

Figure 11:
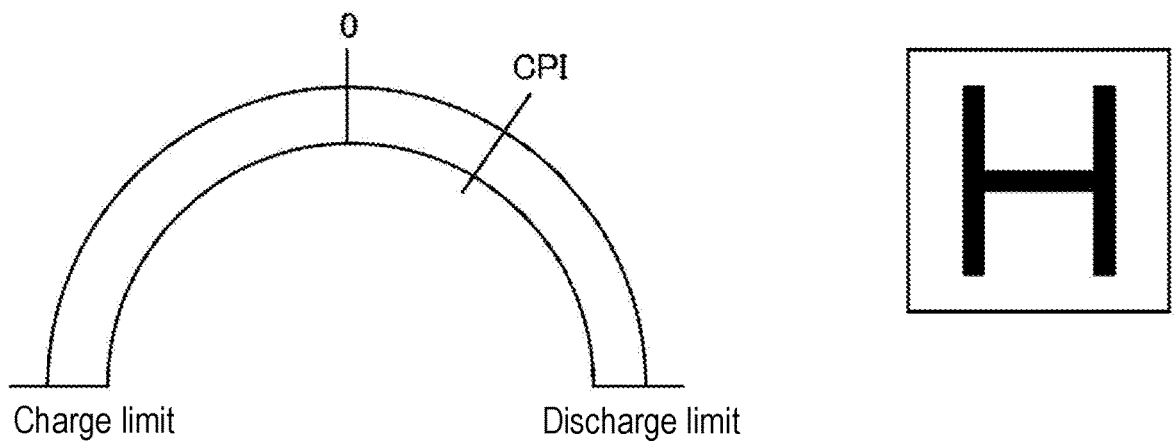
FIG. 11 is a diagram showing another display example of the power meter and the battery temperature meter in the battery temperature display device of the vehicle of FIG. 1.
Figure 12:
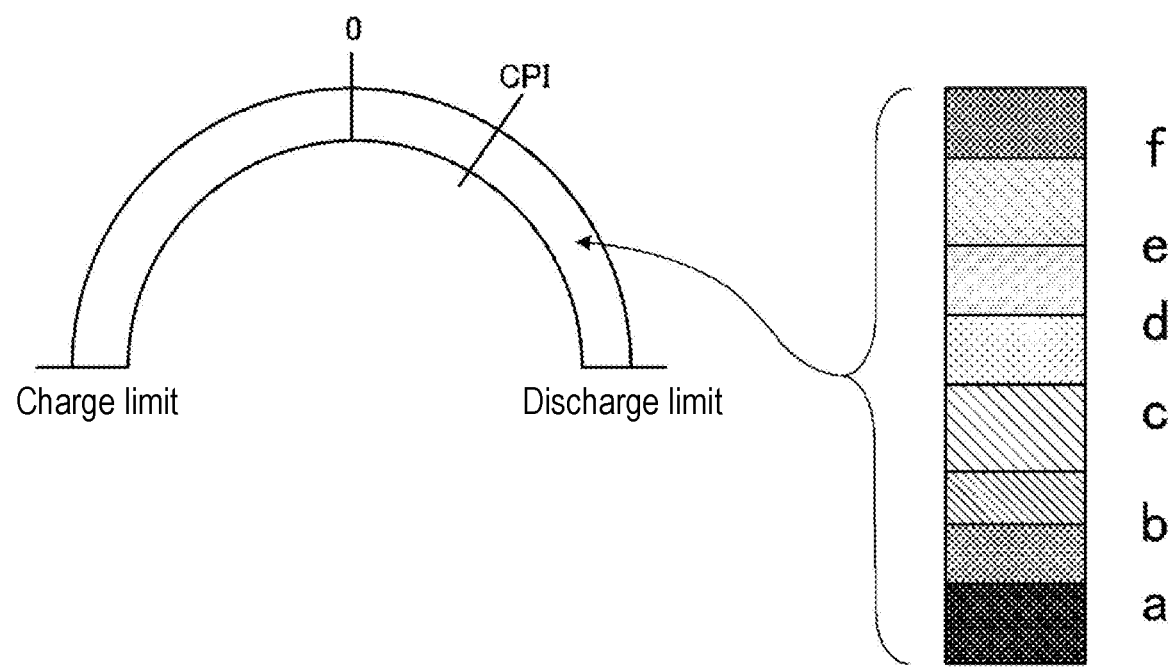
FIG. 12 is a diagram showing another display example in which the power meter and the battery temperature meter in the battery temperature display device of the vehicle of FIG. 1 are integrated.

The battery temperature meter display of FIG. 11 does not indicate the current value but shows a discrete display according to which range the current value of the temperature corresponds to when divided into a plurality of ranges. That is, characters or other display patterns corresponding to each of a plurality of previously divided temperature ranges of the secondary battery 1 are determined, and a display pattern indicating the temperature range to which the current value of the temperature belongs is displayed. The example of FIG. 11 displays a letter "H" indicating the temperature range where the temperature value is greater than or equal to the value corresponding to the power limit value on the upper limit side.

FIG. 12 is a display mode in which the power meter 5 and the battery temperature meter 6 are integrally provided. The segment for temperature display shown on the right side does not actually exist but conceptually expresses that the display colors in the color segments as described with reference to FIG. 8 are displayed on the display part of the semi-arc band in the power meter. In the power meter display in the example of FIG. 12, the apex of the semi-arc band is graduated with the charge/discharge power of 0. The portion denoted as "charge limit" at the end portion that drops from this 0 to the left side corresponds to the charge power limit value. Further, the portion denoted as "discharge limit" at the end portion that drops from this 0 to the right side corresponds to the discharge power limit value. An indication bar CPI indicates the power at the present time.

In any of the display examples of the power meter 5 and the battery temperature meter 6 illustrated in FIGS. 8 to 12, the boundaries between the upper limit segment 61, the lower limit segment 62 and other segments or the thresholds related to the divisions of the display temperature are changed based on the temperature segment threshold data CTS from the battery temperature segment calculation part 15 of the display control device TIU.

In addition, if the change of the boundaries between the upper limit segment 61, the lower limit segment 62 and other segments or the thresholds related to the divisions of the display temperature is excessively frequently made, there may be a case where the driver of the vehicle V worries about a failure in the battery temperature meter 6 itself or other relevant parts, etc., and feels a sense of incongruity instead. Therefore, in a case where a change factor which relates to the boundaries of the segments or the thresholds related to the divisions of the display temperature has continued beyond a predetermined dead zone period and in a mode which allows the change, the device of the present embodiment forms the temperature segment threshold data CTS in the battery temperature segment calculation part 15. As a result, the change is not made excessively frequently, and a stable temperature display is performed, and the driver is hard to feel a further sense of incongruity in the correlation between the change in the behavior of the vehicle and the display value of the temperature of the secondary battery.

In the battery temperature meter 6 in the device of the present embodiment, the change of the boundaries between the upper limit segment 61, the lower limit segment 62 and other segments or the thresholds related to the divisions of the display temperature is made based on any one of the following conditions (a) to (c) or a combination thereof:

(a) whether an operation state of the vehicle is during the traveling or during the charge for the secondary battery;

(b) whether a use state of the secondary battery is during the discharge or during the charge with regenerative power; and (c) whether a duration of the charge and discharge of the secondary battery has exceeded a predetermined dead zone period related to the change.

In the battery temperature display device of the vehicle according to the present embodiment, the following effects are obtained.

(1) The battery temperature display device of the vehicle according to the present embodiment changes the mode of the temperature display, which uses the plurality of segments sequentially arranged according to the values of the display temperature so as to respectively display each of the plurality of temperature ranges into which the predetermined total temperature display range of the secondary battery 1 is divided, on the battery temperature meter 6. That is, the mode of temperature display on the battery temperature meter 6 is changed based on the temperature segment threshold data CTS calculated and output by the battery temperature segment calculation part 15 of the display control device TIU in accordance with the operation state of the vehicle V or the use state of the secondary battery 1. The plurality of segments on the battery temperature meter 6 include the upper limit segment 61 and the lower limit segment 62, wherein the upper limit segment 61 is the highest temperature display segment for displaying the temperature range of the highest temperature in which the discharge and charge of the secondary battery 1 are restricted, and the lower limit segment 62 is the lowest temperature display segment for displaying the temperature range of the lowest temperature for the restriction. The boundaries between the upper limit segment 61, the lower limit segment 62 and other display segments or the thresholds related to the divisions of the display temperature are changed in accordance with the operation state of the vehicle or the use state of the secondary battery. Therefore, the driver can recognize the extent to which the temperature of the secondary battery 1 affects the change in the battery performance at the present time. As a result, the driver can estimate the extent of change in the behavior of the vehicle V caused by the change in the performance of the secondary battery 1, and the driver is hard to feel a sense of incongruity in the correlation between the change in the behavior of the vehicle V and the display value of the temperature of the secondary battery 1.

In the battery temperature display device of the vehicle of (2), the mode of temperature display on the battery temperature meter 6 is changed by the battery output segment calculation part 14 and the battery temperature segment calculation part 15 with (a) whether the operation state of the vehicle V is during the traveling or during the charge for the secondary battery 1 and (b) whether the use state of the secondary battery 1 is during the discharge or during the charge with regenerative power taken into consideration based on the vehicle status data ISV which is output data of the vehicle state obtaining part of the display control device TIU. The change of the mode of the temperature display is made as a change of the boundaries between the upper limit segment 61, the lower limit segment 62 and other display segments or the thresholds related to the divisions of the display temperature. As in the above (a) and (b), since the boundaries between the upper limit segment 61, the lower limit segment 62 and other display elements or the thresholds related to the divisions of the display temperature are changed in accordance with whether it is in the discharge state or in the charge state for the secondary battery, the driver is hard to feel a sense of incongruity in the correlation between the change in the behavior of the vehicle and the display value of the temperature of the secondary battery 1. Further, in accordance with the condition (c) of whether the duration of the charge and discharge of the secondary battery has exceeded the predetermined dead zone period related to the change of the boundaries or the thresholds related to the divisions of the display temperature, the temperature segment threshold data CTS calculated and output by the battery temperature segment calculation part 15 is output in a state in which the boundaries between the upper limit segment 61, the lower limit segment 62 and other display elements or the thresholds related to the divisions of the display temperature are changed in a case where the charge and discharge of the secondary battery has continued beyond the dead zone period. As a result, the change of the boundaries or the thresholds is not made excessively frequently, and a stable temperature display is performed, and the driver is hard to feel a further sense of incongruity in the correlation between the change in the behavior of the vehicle and the display value of the temperature of the secondary battery.

An embodiment of the disclosure has been described above, but the disclosure is not limited thereto. The configuration of the details may be appropriately modified within the scope of the effects of the disclosure. For example, the temperature display on the battery temperature meter 6 may use a display mode in which the display in a single segment for displaying a value corresponding to the value in a range between the power limit value on the upper limit side and the power limit value on the lower limit side is expanded and contracted in the vertical direction.

What is claimed is:

1. A battery temperature display device of a vehicle for displaying a temperature of a secondary battery which supplies power to a motor generator connected to drive wheels, comprising:
   a plurality of display elements sequentially arranged according to values of a display temperature so as to respectively display each of a plurality of temperature ranges into which a predetermined total temperature display range of the secondary battery is divided,
      wherein the plurality of display elements comprise a highest temperature display element that displays a temperature range of a highest temperature in which discharge and charge of the secondary battery are restricted in the total temperature display range, and a lowest temperature display element that displays a temperature range of a lowest temperature in which the discharge and charge of the secondary battery are restricted in the total temperature display range; and
   a display control part for changing boundaries between the highest temperature display element, the lowest temperature display element and other display elements or thresholds related to divisions of the display temperature in accordance with an operation state of the vehicle or a use state of the secondary battery.

2. The battery temperature display device of the vehicle according to claim 1, wherein the display control part makes a change of the boundaries or the thresholds based on any one of following conditions (a) to (c) or a combination thereof:
   (a) whether the operation state of the vehicle is during traveling or during the charge for the secondary battery;
   (b) whether the use state of the secondary battery is during the discharge or during the charge with regenerative power; and
   (c) whether a duration of the charge and discharge of the secondary battery has exceeded a predetermined dead zone period related to the change.

* * * * *